US007643150B2

(12) United States Patent
Nawata

(10) Patent No.: US 7,643,150 B2
(45) Date of Patent: Jan. 5, 2010

(54) OPTICAL APPARATUS, EXPOSURE APPARATUS, AND DEVICE MANUFACTURING METHOD

(75) Inventor: Ryo Nawata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 275 days.

(21) Appl. No.: 11/835,022

(22) Filed: Aug. 7, 2007

(65) Prior Publication Data

US 2008/0037029 A1 Feb. 14, 2008

(30) Foreign Application Priority Data

Aug. 11, 2006 (JP) .............................. 2006-220637

(51) Int. Cl.
*G01B 9/02* (2006.01)

(52) U.S. Cl. ....................................... 356/490; 359/493

(58) Field of Classification Search ................. 356/500, 356/614, 615, 490, 486, 498, 493
See application file for complete search history.

(56) References Cited

U.S. PATENT DOCUMENTS 3,928,094 A * 12/1975 Angell ........................ 438/16
7,133,115 B2 11/2006 Nawata et al. ................ 355/53
7,221,460 B2 * 5/2007 Ohtsuka ..................... 356/508
2005/0063288 A1 3/2005 Nawata et al. .............. 369/125

FOREIGN PATENT DOCUMENTS

JP 2005-236258 9/2005

* cited by examiner

*Primary Examiner*—Hwa S Lee (Andrew)
(74) *Attorney, Agent, or Firm*—Fitzpatrick, Cella, Harper & Scinto

(57) ABSTRACT

An optical apparatus includes a first element, a second element, a support which supports the first element, a first measuring device which measures the position of the first element relative to the support, a second measuring device which measures the position of the second element relative to the support, a third measuring device which measures any deformation of the support, and a controller. The controller controls the relative position between the first element and the second element on the basis of the measurement results obtained by the first measuring device, the second measuring device, and the third measuring device.

10 Claims, 16 Drawing Sheets

F I G. 5
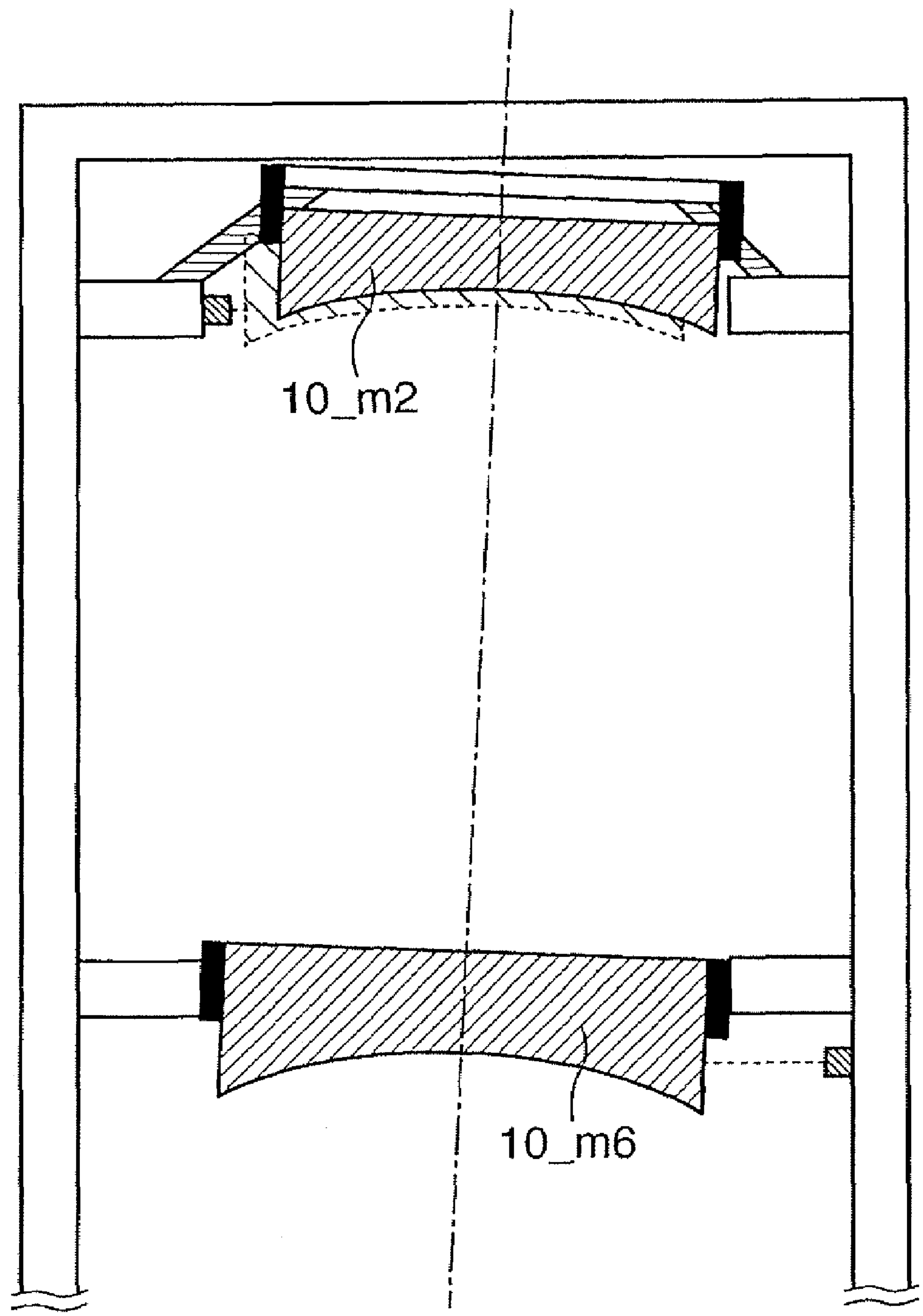

OPTICAL APPARATUS, EXPOSURE APPARATUS, AND DEVICE MANUFACTURING METHOD

This application claims the benefit of Japanese Patent Application No. 2006-220637, filed Aug. 11, 2006, which is hereby incorporated by reference herein in its entirety.

BACKGROUND OF THE INVENTION

1. Field of the Invention

The present invention relates to an optical apparatus, an exposure apparatus, and a device manufacturing method.

2. Description of the Related Art

A semiconductor exposure apparatus transfers an original having various kinds of patterns onto a substrate, such as a silicon wafer. To generate an integrated circuit, it is indispensable to improve not only the resolution, but also, the overlay accuracy.

Overlay errors in the semiconductor exposure apparatus are classified into an alignment error, image blurring, and a magnification error. Adjusting the relative displacement between an original (reticle) and a substrate (wafer) makes it possible to reduce the alignment error. Moving some optical elements of an optical system makes it possible to eliminate the image blurring and magnification error. In moving the optical elements, it is necessary not to increase a parallel decentration error and an inclined decentration error.

A positive servo system moves and positions the optical elements. A laser interferometer attached to a lens barrel or a reference structure outside it measures the positions of the optical elements.

Along with the recent increase in the degree of micropatterning of semiconductor devices, it is being demanded that optical elements should have a higher position/attitude accuracy and a higher positioning accuracy to correct, e.g., aberration, as compared with the prior art, to obtain required imaging. Disturbance often degrades the positioning accuracy. The influence of the disturbance has been negligible under the conventional positioning control, but it is becoming non-negligible to meet the demand for a higher positioning accuracy. Japanese Patent Laid-Open No. 2005-236258 discloses an example in which positioning control of optical elements, such as a lens barrel, is performed on the basis of only position information obtained by measurement with reference to a support for supporting the optical elements. In this example, elastic deformation of the support causes a measurement error, to result in degradation in the positioning accuracy of the optical elements.

SUMMARY OF THE INVENTION

It is an object of the present invention, e.g., to prevent any change in the relative position between optical elements due to elastic deformation of a support which supports the optical elements.

According to one aspect of the present invention, an optical apparatus includes a first element, a second element, a support which supports the first element, first and second measuring devices which measure the positions of the first and second elements relative to the support, a third measuring device which measures deformation of the support, and a controller. The controller controls the relative position between the first and second elements on the basis of the measurement results obtained by the first to third measuring devices.

According to the present invention, for example, it is possible to prevent any change in the relative position between optical elements due to elastic deformation of a support which supports the optical elements.

Further features of the present invention will become apparent from the following description of exemplary embodiments, with reference to the attached drawings.

BRIEF DESCRIPTION OF THE DRAWINGS

FIG. 5 is a view illustrating a positional shift of a reference optical element;

DESCRIPTION OF THE EMBODIMENTS

Embodiments of the present invention will be described below.

First Embodiment

Figure 1:
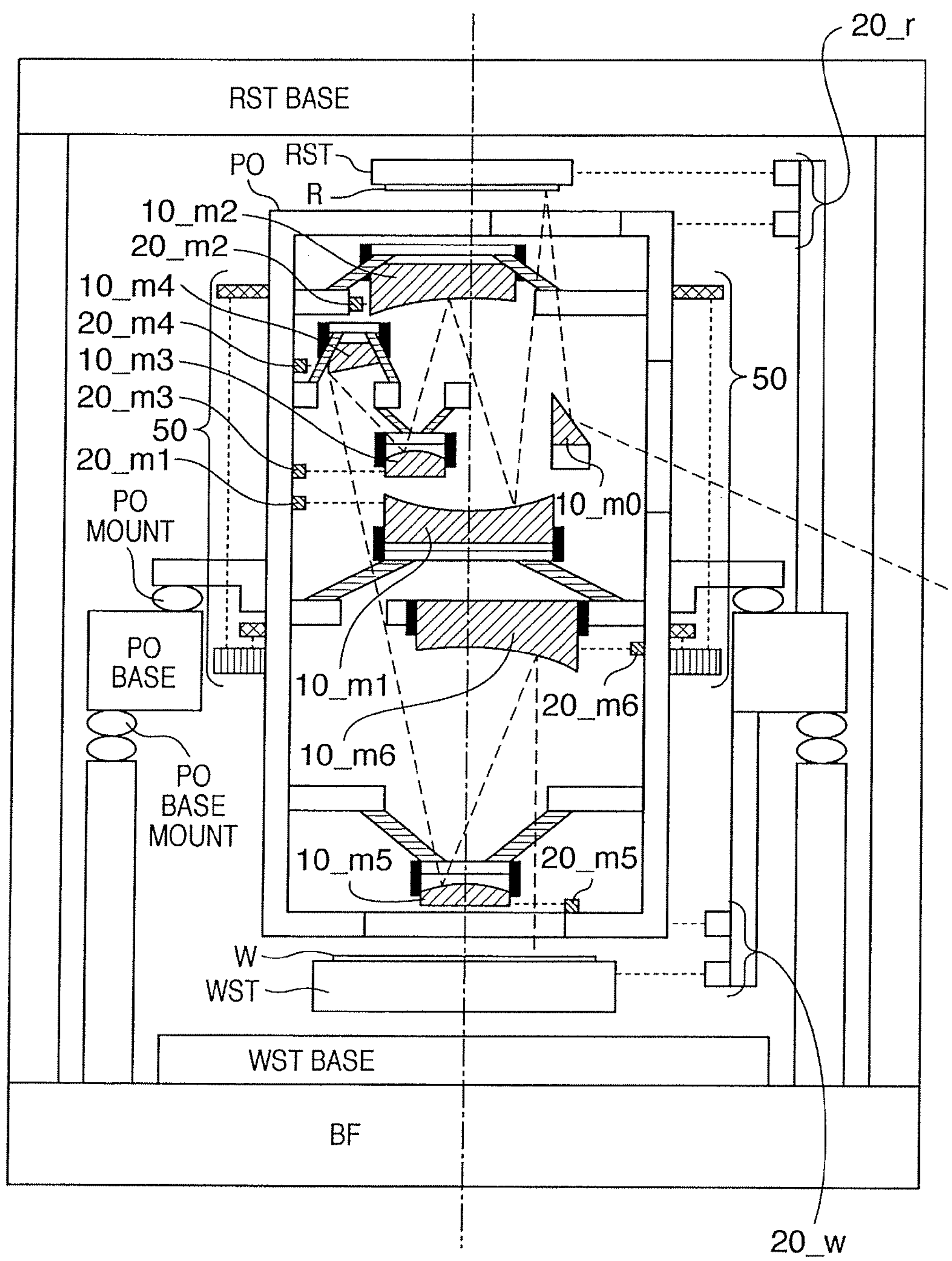
FIG. 1 is a schematic view showing an exposure apparatus.

An exposure apparatus according to the first embodiment of the present invention can be configured as an exposure apparatus (EUV exposure apparatus) using, e.g., EUV (Extreme Ultra Violet) light as exposure light. As shown in FIG. 1, the exposure apparatus comprises an original stage RST, which holds an original (reticle) R, a projection optical system, and a substrate stage WST, which holds a substrate (e.g., a wafer) W. FIG. 1 is a view showing the simplified optical path of the exposure apparatus.

The exposure apparatus using light (e.g., EUV light or X-ray light), having a wavelength of 2 to 40 nm, utilizes reflective optical elements, such as a mirror. Since light absorption is great in various substances in this wavelength range, a lens optical system using refraction of light, as used for visible light or ultraviolet light, is impractical. The original R uses, e.g., a reflective reticle on which a pattern to be transferred is formed on a multilayer reflector by an absorber. Such a reflective optical element uses light reflection. When the optical element inclines under the influence of a disturbance, the reflected light is especially susceptible to it. Accordingly, the present invention is especially effective for an exposure apparatus using light (e.g., EUV light or X-ray light), having a wavelength of 2 to 40 nm, as exposure light.

The light source can use, e.g., a laser plasma light source. The laser plasma light source irradiates a target material in a vacuum container with high-intensity pulse laser light to generate a high-temperature plasma, thereby using EUV light, which is radiated by the plasma and has a wavelength of, e.g., about 13 nm. All the techniques known to those skilled in the art are applicable to the EUV light source, and a detailed description thereof will be omitted.

Exposure light emitted by the light source strikes the pattern on the original R via an illumination optical system. The illumination optical system has a function of illuminating the original R by propagating EUV light, and has a plurality of mirrors, an optical integrator, and an aperture. The optical integrator serves to uniformly illuminate the original R with a predetermined numerical aperture. The aperture is set at a position conjugate to the original R, and limits the illumination region on the surface of the original R to an arc.

The projection optical system, including a plurality of mirrors, reduces and projects the EUV light selectively reflected by the original R, onto the wafer W coated with a resist, to transfer the pattern on the original R onto the wafer W.

Although the projection optical system shown in FIG. 1 includes six multilayer reflectors, the number of multilayer reflectors may be, e.g., two, five, or eight. The multilayer reflectors will be called a first optical element 10_m1, a second optical element 10_m2, etc., in the order in which exposure light reaches them. The reflection surfaces of the multilayer reflectors have a convex or concave spherical, or an aspherical, shape. The numerical aperture NA is about 0.2 to 0.3

Figure 2:
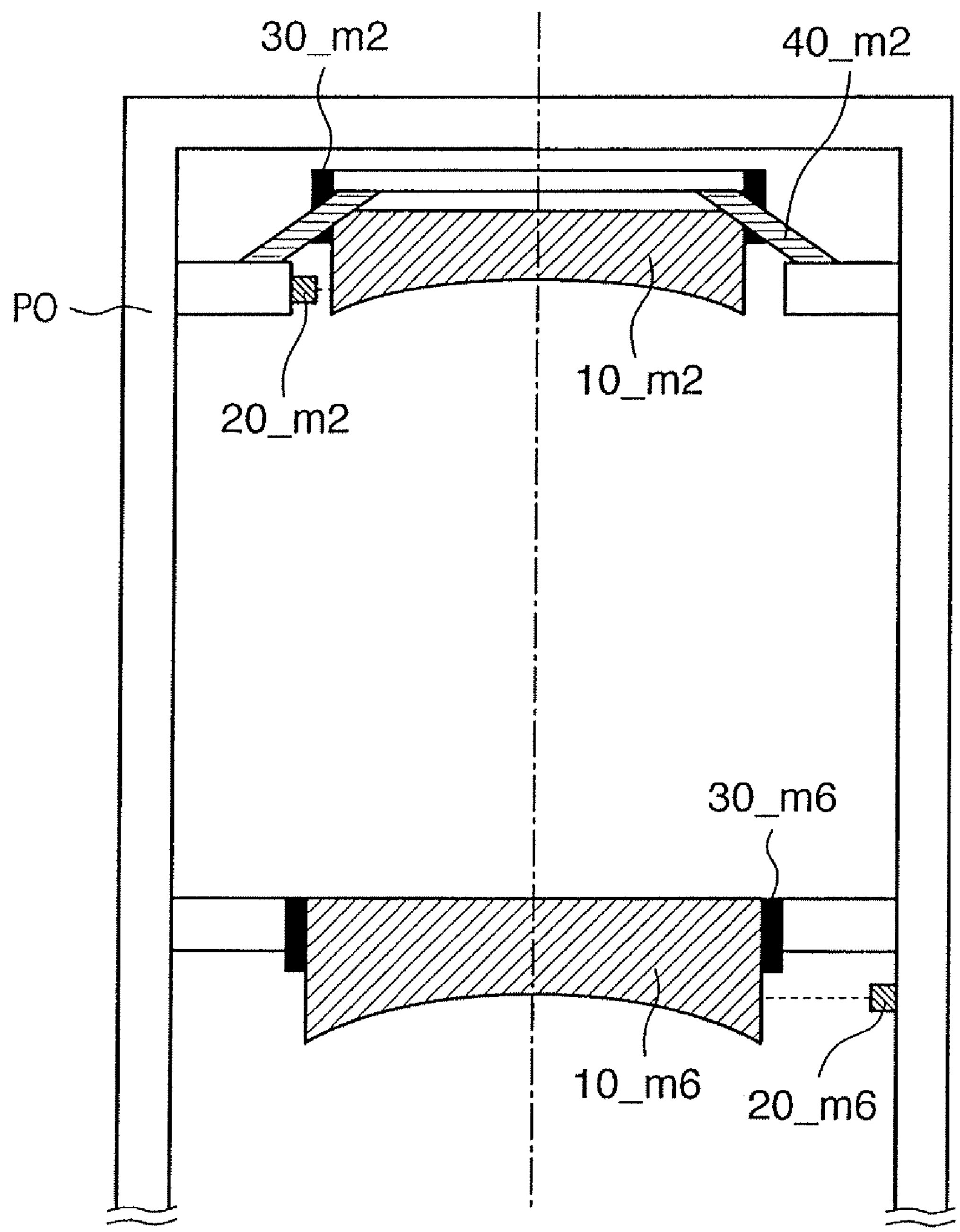
FIG. 2 is a view showing the control mechanism of an optical element.

A sixth optical element 10_m6 is assumed to be an optical element having a highest optical sensitivity here. As shown in FIG. 2, a lens barrel PO, serving as a support of the first to sixth optical elements, supports the sixth optical element 10_m6 via a holding mechanism 30_m6. The lens barrel is assumed to be the measurement reference of the optical elements 10 here. Fine moving mechanisms 40_m1 to 40_m5 control the other optical elements 10_m1 to 10_m5 to keep constant the relative positional relationships with the sixth optical element 10_m6 having a highest optical sensitivity. Although the fine moving mechanism 40 uses a six-axis parallel linkage mechanism, here, a linear motor, or the like, may perform six-axis control. Although an actuator of the six-axis parallel linkage mechanism uses a piezoelectric element, it may use, e.g., a picomotor.

Figure 3:
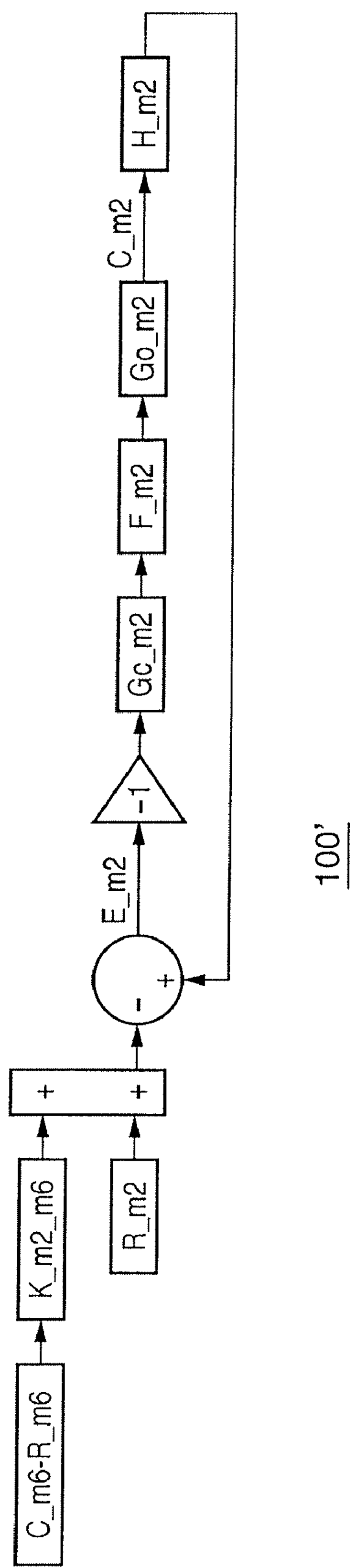
FIG. 3 is a control block diagram of the optical element.

A method of controlling the positioning of the optical elements 10 will be explained by taking the second optical element 10_m2 as an example. In this case, the sixth optical element 10_m6 corresponds to the first element, and the second optical element 10_m2 corresponds to the second element. With reference to the lens barrel PO, a measuring apparatus (second measuring device) 20_m2 measures the position, having six degrees of freedom, of the second optical element 10_m2, shown in FIG. 2. For the sake of simplicity, a detailed arrangement of the measuring apparatus 20_m2 is not illustrated in FIG. 2. Likewise, a measuring apparatus (first measuring device) 20_m6 measures the position, having six degrees of freedom, of the sixth optical element 10_m6 with reference to the lens barrel PO. Using the pieces of measurement information obtained by the measuring apparatuses 20_m2 and 20_m6, the second optical element 10_m2 is controlled to keep its position relative to the sixth optical element 10_m6 constant. FIG. 3 is a block diagram for controlling the second optical element 10_m2 by a control system (controller) 100'.

Referring to FIG. 3, reference symbol R_m2 denotes the command value of the second optical element 10_m2; and reference symbol C_m2 denotes measurement information. Reference symbol R_m6 denotes the command value of the sixth optical element 10_m6; and reference symbol C_m6 denotes measurement information. Reference symbol Gc_m2 denotes a controller of the second optical element 10_m2; and reference symbol Go_m2 denotes a transfer function from the input of the fine moving mechanism 40_m2 of the second optical element 10_m2 to the output of the measuring apparatus 20_m2. Reference symbol H_m2 denotes a decoupled matrix for converting the measurement information C_m2, obtained by the measuring apparatus 20_m2, into six-axis position information at a control point; and reference symbol F_m2 denotes a thrust distribution matrix for distributing a thrust to each actuator of the fine moving mechanism 40_m2 to apply a force to the control point. Reference symbol K_m2_m6 denotes a conversion matrix for calculating a positional shift of the second optical element 10_m2 as the sixth optical element 10_m6 shifts.

Figure 4:
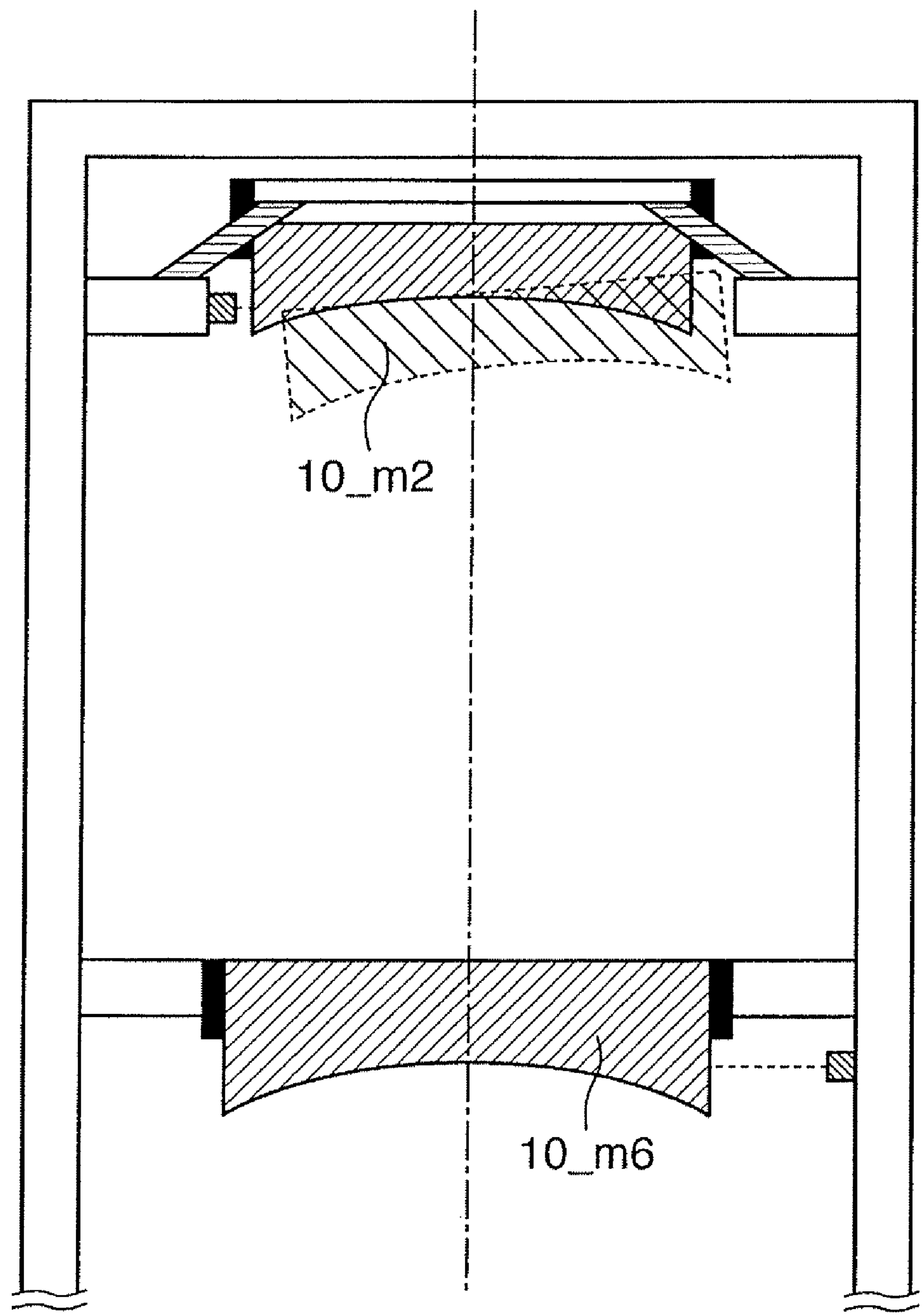
FIG. 4 is a view illustrating a positional shift of the optical element.

When the second optical element 10_m2 shifts to a position indicated by a dotted line in FIG. 4, the control system 100' controls the second optical element 10_m2 to keep its position relative to the sixth optical element 10_m6 constant by the positioning control illustrated in the block diagram of FIG. 3. In addition, as shown in FIG. 5, when the sixth optical element 10_m6 shifts, the control system 100' controls the position of the second optical element 10_m2 to keep the relative positional relationship between the sixth optical element 10_m6 and the second optical element 10_m2 constant. The control system 100' performs positioning control for the first, third, fourth, and fifth optical elements in the same manner as for the second optical element 10_m2.

Figure 6:
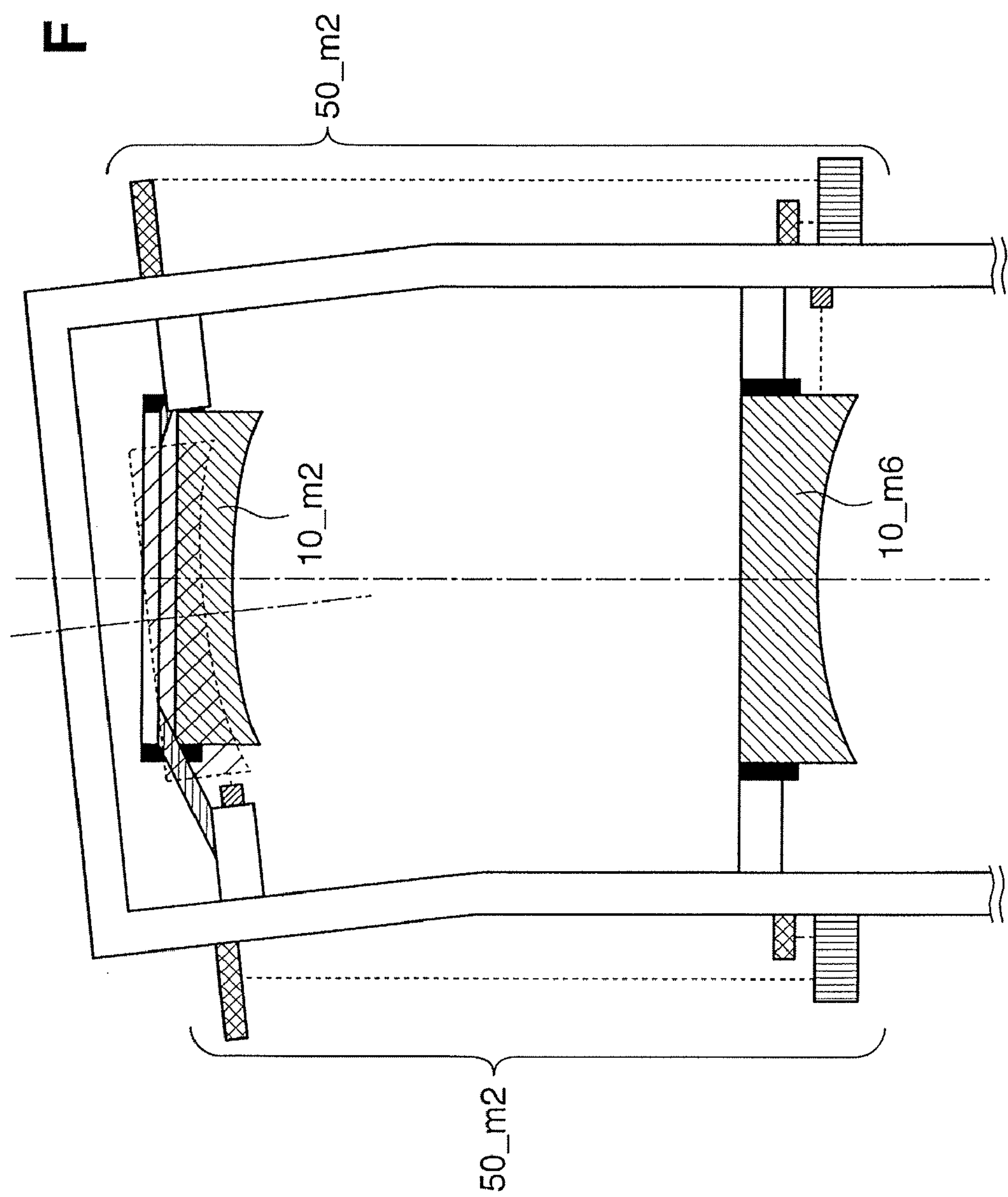
FIG. 6 is a view illustrating a positional shift of the optical element due to deformation of a lens barrel.
Figure 7:
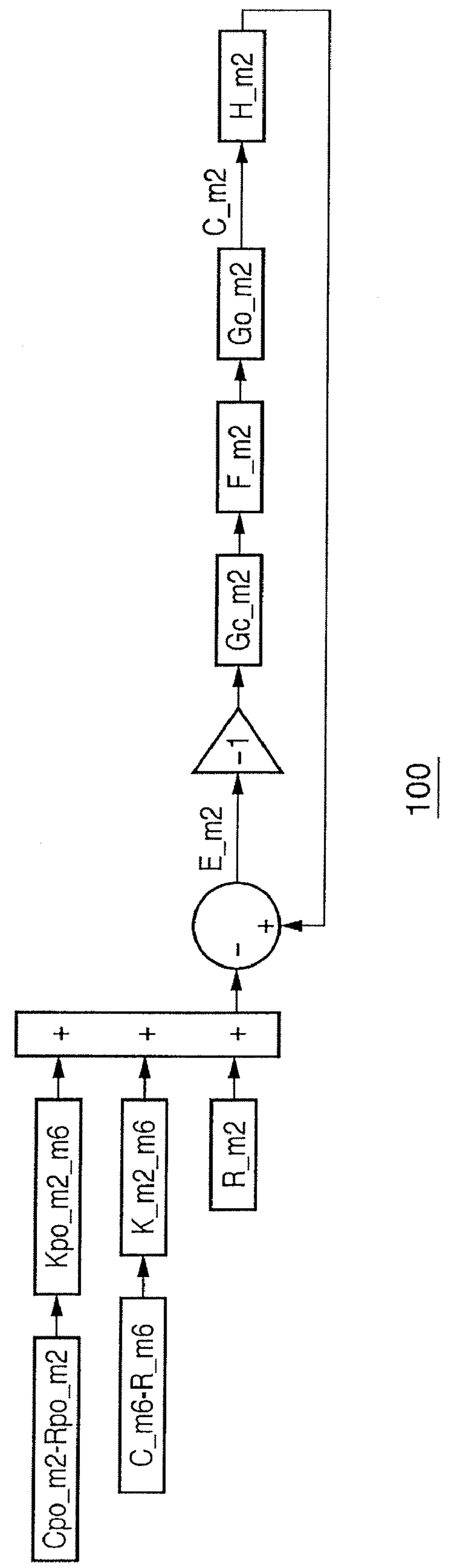
FIG. 7 is a control block diagram of the optical element in feeding back deformation of the lens barrel.

However, when the lens barrel PO elastically deforms, as shown in FIG. 6, the control system 100' cannot control operation to keep the relative positional relationship between the sixth optical element 10_m6 and the second optical element 10_m2 constant by the block diagram shown in FIG. 3. To solve this problem, according to the preferred embodiment of the present invention, a measuring apparatus (third measuring device) 50_m2 for measuring the elastic deformation amount of the lens barrel PO is provided, as shown in FIG. 6, to control the second optical element 10_m2, including the elastic deformation amount of the lens barrel PO. FIG. 7 is a block diagram of the control system 100' in this case. Referring to FIG. 7, reference symbol Cpo_m2 denotes measurement information obtained by the measuring apparatus 50_m2; and reference symbol Rpo_m2 denotes the target value (e.g., 0) of deformation of the lens barrel. Reference symbol Kpo_m2_m6 denotes a correction matrix for multiplying the deformation amount of the lens barrel PO by a given correction amount. Even when the second optical element 10_m2 shifts to the position indicated by a dotted line in FIG. 6 due to elastic deformation of the lens barrel PO, the control system 100' can control operation to keep the relative positional relationship with the sixth optical element 10_m6 constant.

If the optical element 10 is a reflective optical element, its positioning accuracy requirement, especially in angles around the X- and Y-axes of the six axes, is strict, because of the use of light reflection. It is, therefore, necessary to measure the elastic deformation amounts of the lens barrel PO, at least around the X- and Y-axes, and feed them back to the positioning of the optical element 10. In view of this, a method of measuring the elastic deformation amounts of the lens barrel PO around the Z-, X-, and Y-axes will be explained next.

Figure 8:
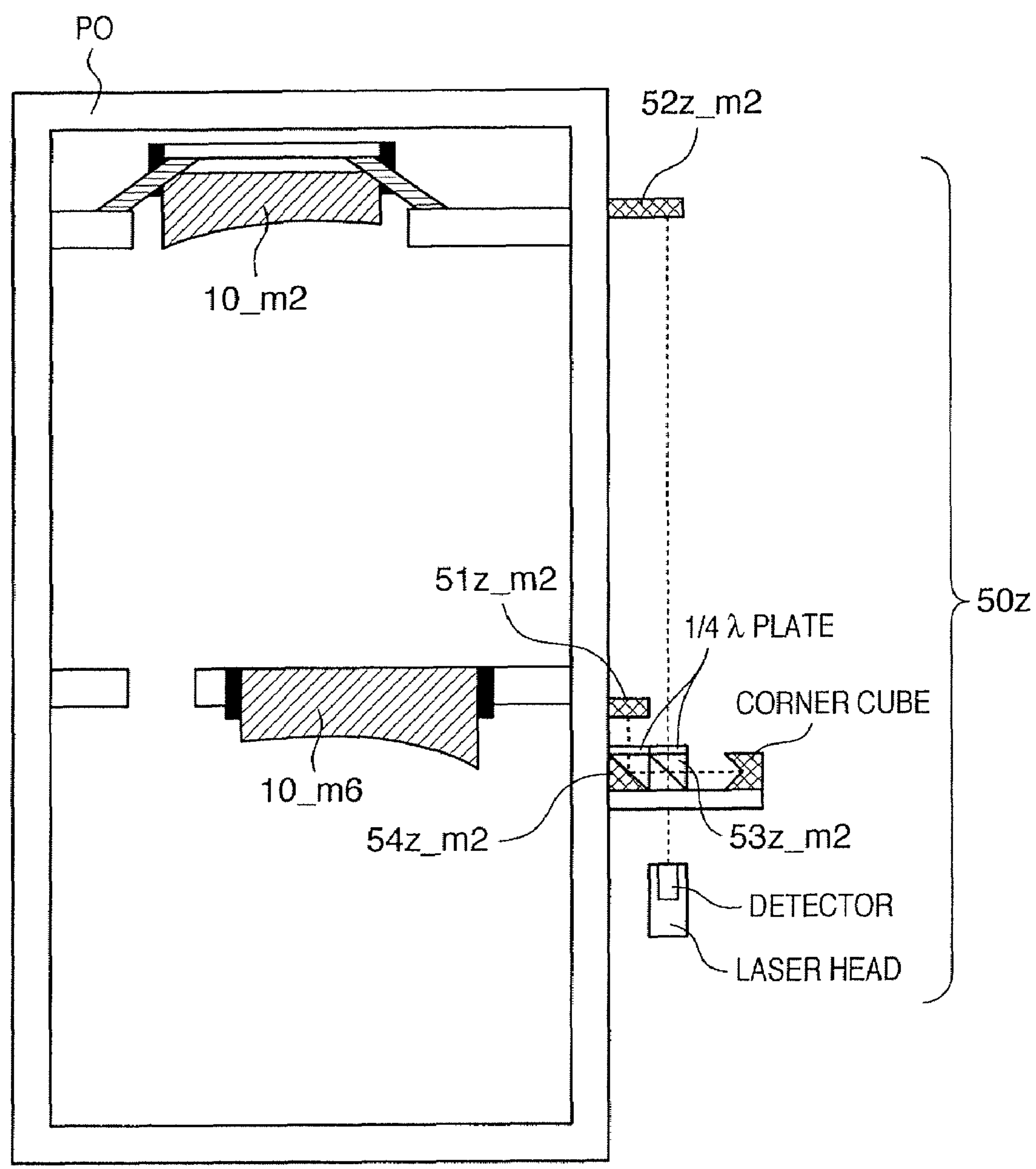
FIG. 8 is a schematic view showing a Z measuring unit for measuring deformation of the lens barrel in the Z direction.

A Z measuring unit 50*z* is a heterodyne laser interferometer for measuring the relative displacement in the Z direction. As shown in FIG. 8, a mirror 51*z*_m2 for measurement corresponding to the sixth optical element is fixed to the lens barrel in the vicinity of the sixth optical element, such that the mirror plane perpendicularly intersects the Z-axis. A mirror 52*z*_m2 for measurement corresponding to the second optical element 10_m2 is fixed to the lens barrel PO in the vicinity of the second optical element 10_m2, such that the mirror plane perpendicularly intersects the Z-axis. The mirrors 51*z*_m2 and 52*z*_m2 for measurement are the first and second mirrors for measurement, respectively corresponding to the first and second optical elements. A polarized beam splitter 53*z*_m2 for splitting laser light emitted by a laser head into reflected light and transmitted light is provided. A mirror 54*z*_m2 for further reflecting, toward the mirror 51*z*_m2 for measurement, the reflected light split by the polarized beam splitter 53*z*_m2, is inserted in the optical path between the laser head and the mirror 51*z*_m2 for measurement. The polarized beam splitter 53*z*-m2 and mirror 54*z*-m2 are attached to the same supporting member. This makes it possible to measure the relative change amount, in the Z-axis direction, between the mirrors 51*z*_m2 and 52*z*_m2 for measurement.

Figure 9:
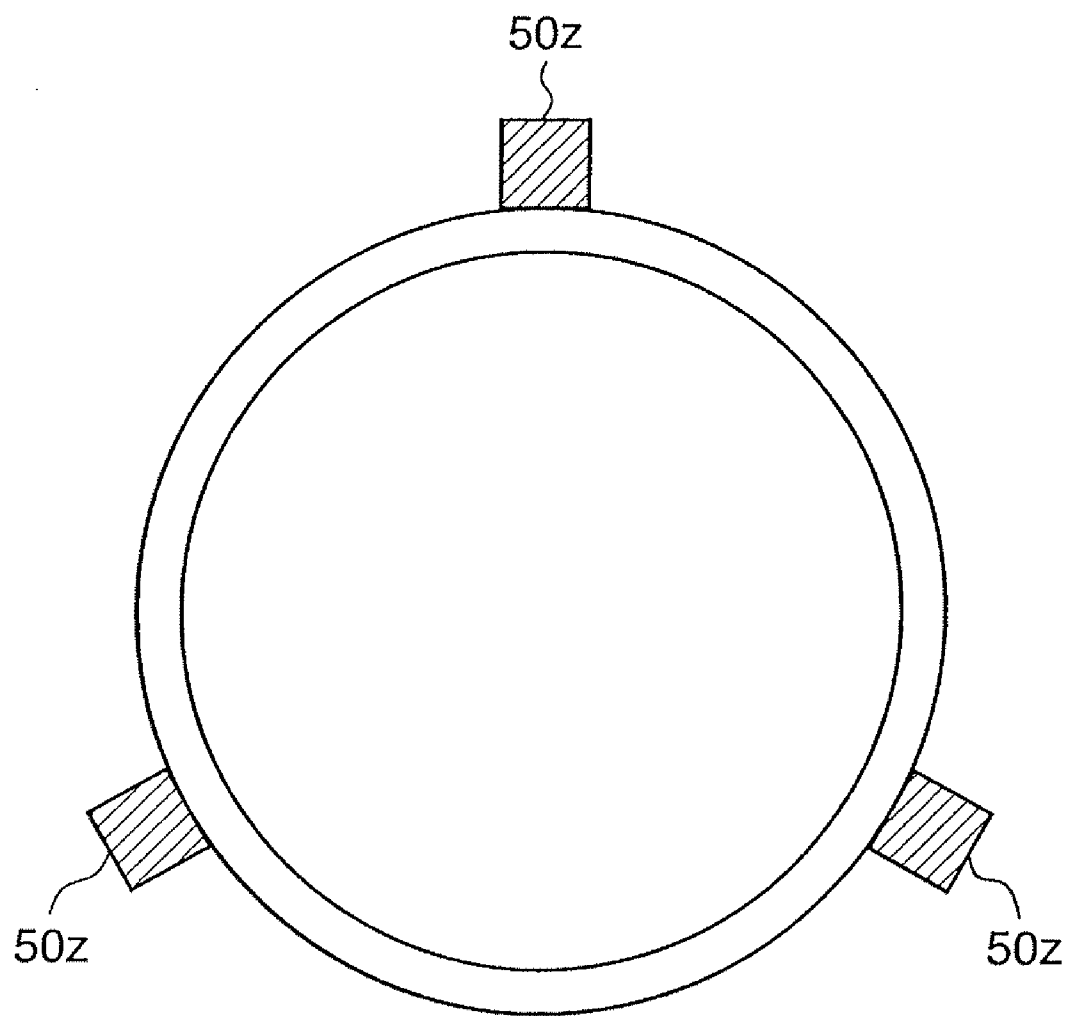
FIG. 9 is a view showing the arrangement of the Z measuring unit for measuring deformation of the lens barrel in the Z direction.

As shown in FIG. 9, three measuring units 50*z* are attached to the lens barrel. On the basis of their measurement results, it is possible to calculate the deformation angles around the X- and Y-axes resulting from elastic deformation of the lens barrel. The number of measuring units 50*z* for measuring deformation of the lens barrel serving as a support is not limited to three, and more measuring units 50*z* may be attached to the lens barrel. Although the measuring units 50*z* are attached outside the lens barrel in FIG. 8, they may be attached inside the lens barrel. The inside of the lens barrel has a higher degree of vacuum than its outside. Hence, attaching the measuring units 50*z* inside the lens barrel has a merit of producing fewer measurement errors of the laser interferometer due to air fluctuation.

Referring to FIG. 8, the mirror 52*z*_m2 for measurement is attached to the vicinity of the second optical element 10_m2, to make the second optical element 10_m2 follow the sixth optical element 10_m6. To make another optical element follow the sixth optical element 10_m6, it suffices to attach a mirror for measurement to the vicinity of the optical element to follow.

The deformation amount at a given position of the lens barrel, that is measured by the measuring units 50*z*, may be multiplied by a given coefficient, to estimate the deformation amount at its other position.

In the first embodiment, the position of the optical element 10 is measured from the lens barrel PO. When the position of the optical element 10 is to be measured from a reference structure other than the lens barrel PO, it suffices to attach a measuring unit 50*z* to the reference structure and feed back deformation of the reference structure.

Although the measuring unit 50*z* uses a laser interferometer in the first embodiment, it may use, e.g., a piezoelectric device, a capacitance sensor, or an eddy current sensor.

Second Embodiment

Figure 10:
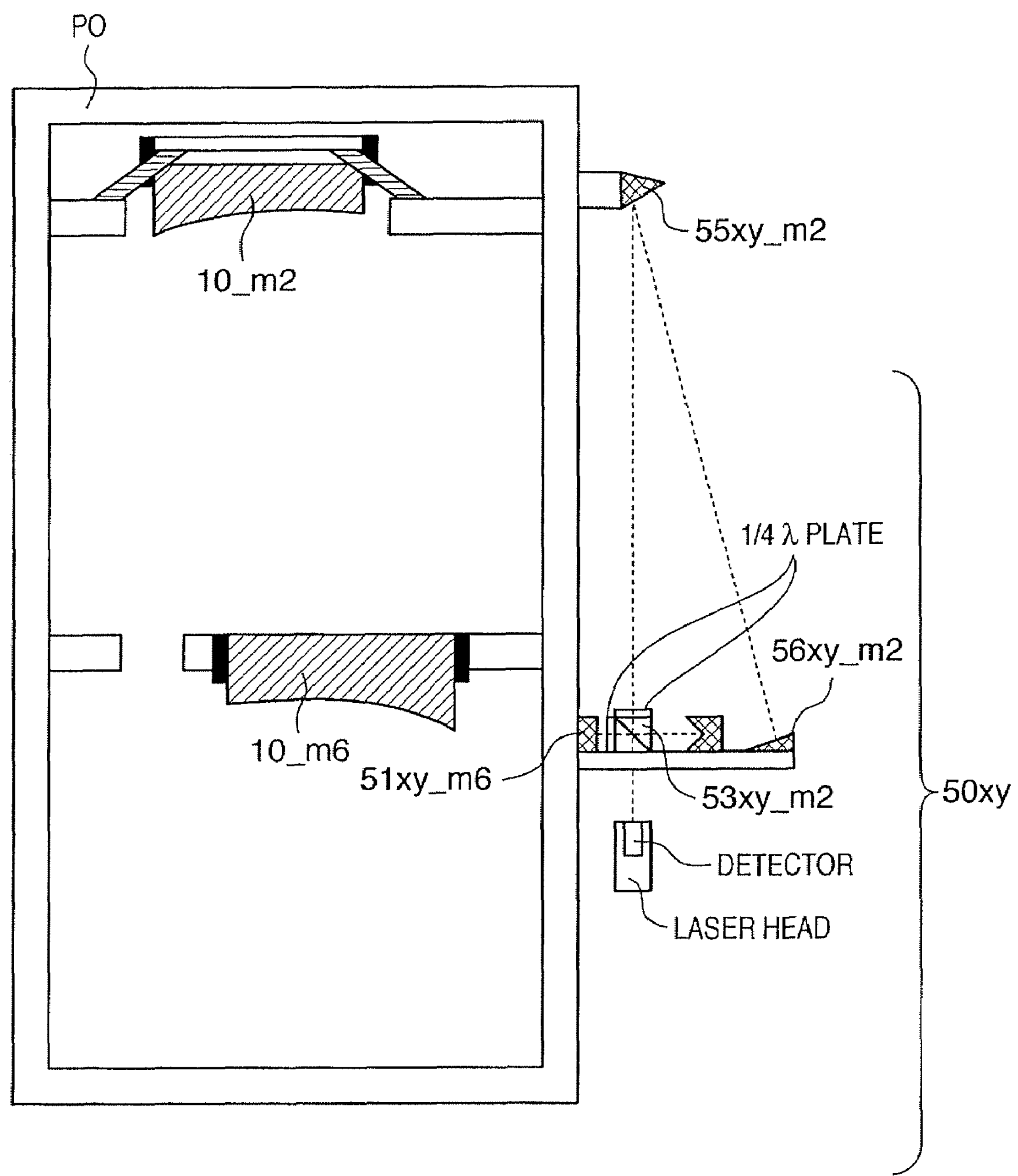
FIG. 10 is a schematic view showing X and Y measuring units for measuring deformation of the lens barrel in the X and Y directions.

In the first embodiment, the elastic deformation amounts of the lens barrel only in the Z-axis direction and around the X- and Y-axes are measured. However, adding a measuring unit 50*xy* to the arrangement of the first embodiment makes it possible to measure the elastic deformation amounts in the X- and Y-axis directions and around the Z-axis. FIG. 10 shows the measuring unit 50*xy* for measuring the deformation amounts in the X- and Y-axis directions. The measuring unit 50*xy* to be added includes two or more X measuring units for measuring the relative displacement in the X direction due to deformation of the lens barrel, and one or more Y measuring units for measuring the relative displacement in the Y direction. It is also possible to form the measuring unit 50*xy* by one or more X measuring units and two or more Y measuring units. As in the first embodiment, the measuring unit measures the deformation amount of the lens barrel between the vicinity of the second optical element and the vicinity of the sixth optical element.

The measuring unit 50*xy* is a heterodyne laser interferometer. As shown in FIG. 10, a mirror 51*xy*_m2 for measurement is fixed to the lens barrel in the vicinity of a sixth optical element 10_m6, such that the mirror plane becomes parallel to the Z-axis. A prism 55*xy*_m2 is fixed to the lens barrel in the vicinity of a second optical element 10_m2 here. A polarized beam splitter 53*xy*_m2 for splitting laser light emitted by a laser head into reflected light and transmitted light is provided. A mirror 56*xy*_m2 for reflecting the measurement light, which is transmitted through the polarized beam splitter 53*xy*_m2 and emerges from the prism 55*xy*_m2, is also provided. The mirror 56*xy*_m2, polarized beam splitter 53*xy*_m2, and mirror 51*xy*_m2 for measurement are attached to the same supporting member. The measurement information obtained by the measuring unit 50*xy* includes the displacement amount in the X- or Y-axis direction, caused by deformation of the lens barrel and the displacement amount in the Z-axis direction. Subtracting the relative change amount in the Z-axis direction, which is measured by the Z measuring unit 50*z* shown in the first embodiment, makes it possible to obtain the displacement amount in the X- or Y-axis direction.

Arranging measuring unit 50*xy* in the X- and Y-axis directions makes it possible to measure the elastic displacement amounts of a lens barrel PO in the X- and Y-axis directions. In addition, adding another measuring unit 50*xy* to either the X- or Y-axis direction makes it possible to calculate the rotation amount of the lens barrel PO about the Z-axis resulting from its elastic deformation on the basis of the two measurement values.

Referring to FIG. 10, the prism 55*xy*_m2 for the measuring unit 50*xy* is attached to the vicinity of the second optical element 10_m2 to make the second optical element 10_m2 follow the sixth optical element 10_m6. To make another optical element follow the sixth optical element 10_m6, it suffices to attach a prism in the vicinity of the optical element to follow.

The deformation amount at a given position of the lens barrel, which is measured by the measuring unit 50*xy*, may be multiplied by a given coefficient to estimate the deformation amount at its other position.

In the second embodiment, the position of the optical element 10 is measured from the lens barrel PO. When the position of the optical element 10 is to be measured from a reference structure other than the lens barrel PO, it suffices to attach a measuring unit 50*xy* to the reference structure and feed back deformation of the reference structure.

Although the measuring unit 50*xy* uses a laser interferometer in the second embodiment, it may use, e.g., a piezoelectric device, a capacitance sensor, or an eddy current sensor.

Third Embodiment

Figure 11:
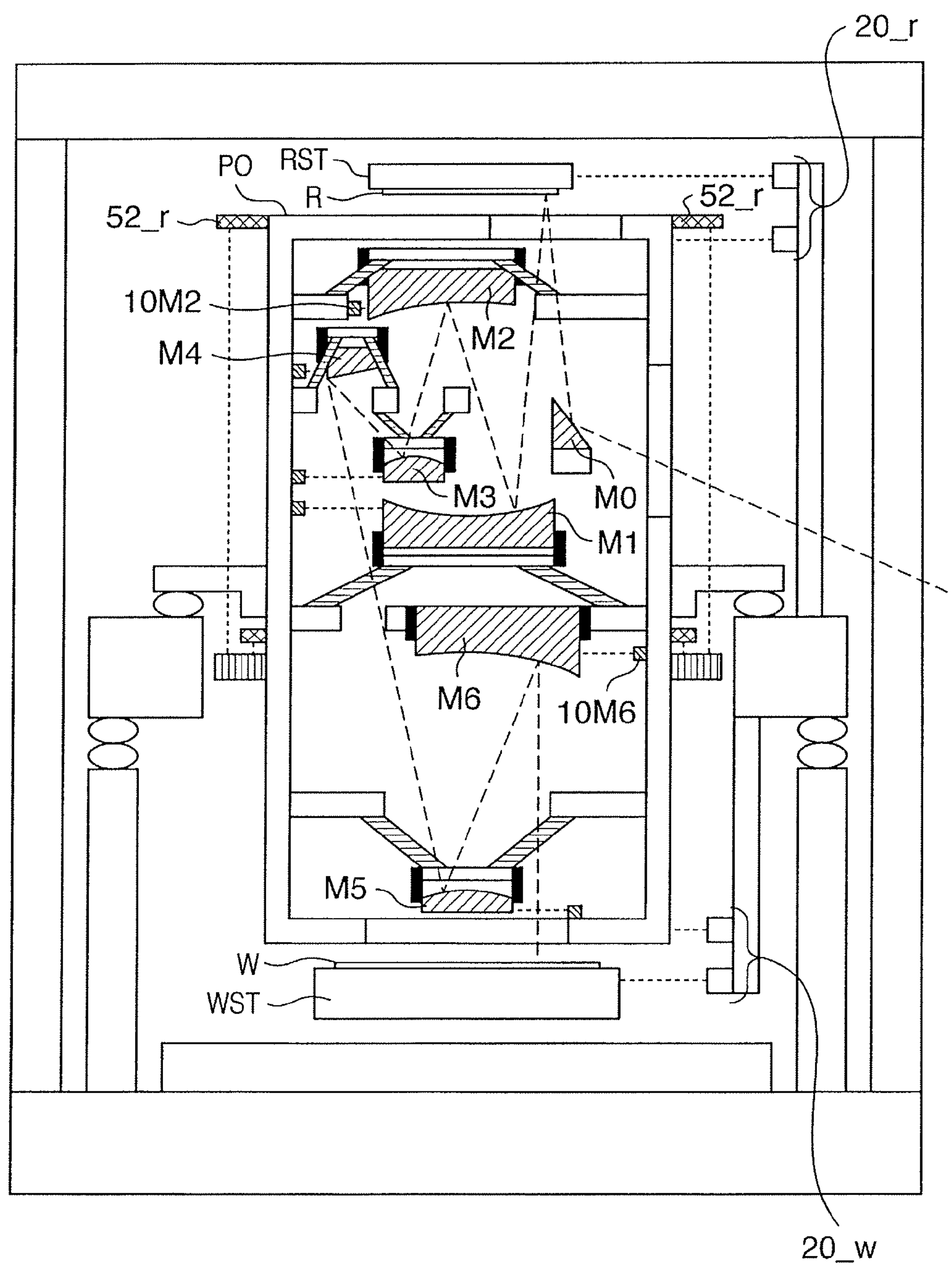
FIG. 11 is a schematic view showing a measuring apparatus for measuring deformation of a lens barrel near an original stage.
Figure 12:
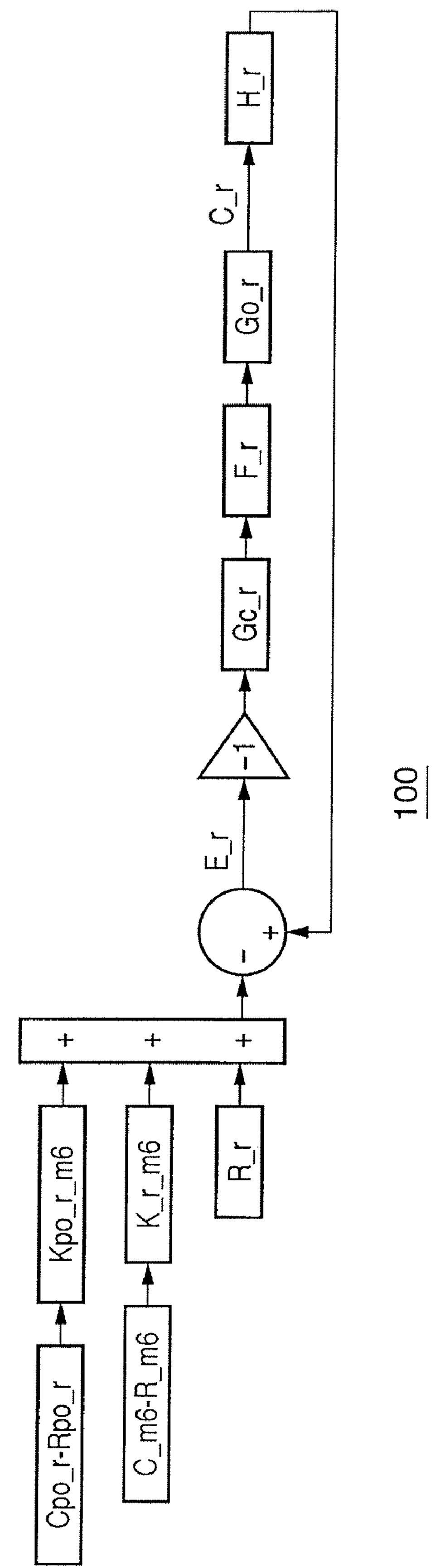
FIG. 12 is a control block diagram of the original stage in feeding back deformation of the lens barrel.

In the first and second embodiments, the second optical element 10_m2 undergoes positioning control with reference to the sixth optical element 10_m6. As shown in FIG. 11, in the same manner as in the first and second embodiments, an original stage RST may be controlled with reference to a sixth optical element 10_m6 in consideration of the elastic deformation amount of a lens barrel PO. It is desirable to locate a mirror 52*z*_r for measurement or prism 55*xy*_r (not shown) as close to the original stage RST as possible. The deformation amount of the lens barrel PO near the original stage RST may be estimated on the basis of the deformation amount of its other portion. FIG. 12 is a block diagram showing a control system 100' in this case. Referring to FIG. 12, reference symbol R_r denotes the target value of the original stage RST; and reference symbol C_r denotes measurement information obtained by a measuring apparatus 20__*r*. Reference symbol Gc_r denotes a controller of the original stage RST; and reference symbol Go_m2 denotes a transfer function from the input of an actuator of the original stage RST to the output of the position measurement sensor. Reference symbol H_r denotes a decoupled matrix for converting the measurement information C_r, obtained by the measuring apparatus 20__*r*, into six-axis position information at a control point. Reference symbol F_r denotes a thrust distribution matrix for distributing a thrust to each actuator of the original stage RST, to apply a force to the control point. Reference symbol K_r_m6 denotes a conversion matrix for calculating a positional shift of the original stage RST, as the sixth optical element 10_m6 shifts. Reference symbol Kpo_r_m6 denotes a correction matrix for multiplying the deformation amount of the lens barrel PO by a given correction amount.

In the third embodiment, the position of the original stage RST is measured with reference to the lens barrel PO. When the position of the original stage RST is to be measured from a reference structure other than the lens barrel PO, it suffices to attach a measuring apparatus 50 to the reference structure and feed back deformation of the reference structure.

Although the measuring apparatus 50 uses a laser interferometer in the third embodiment, it may use, e.g., a piezoelectric device, a capacitance sensor, or an eddy current sensor.

Fourth Embodiment

Figure 13:
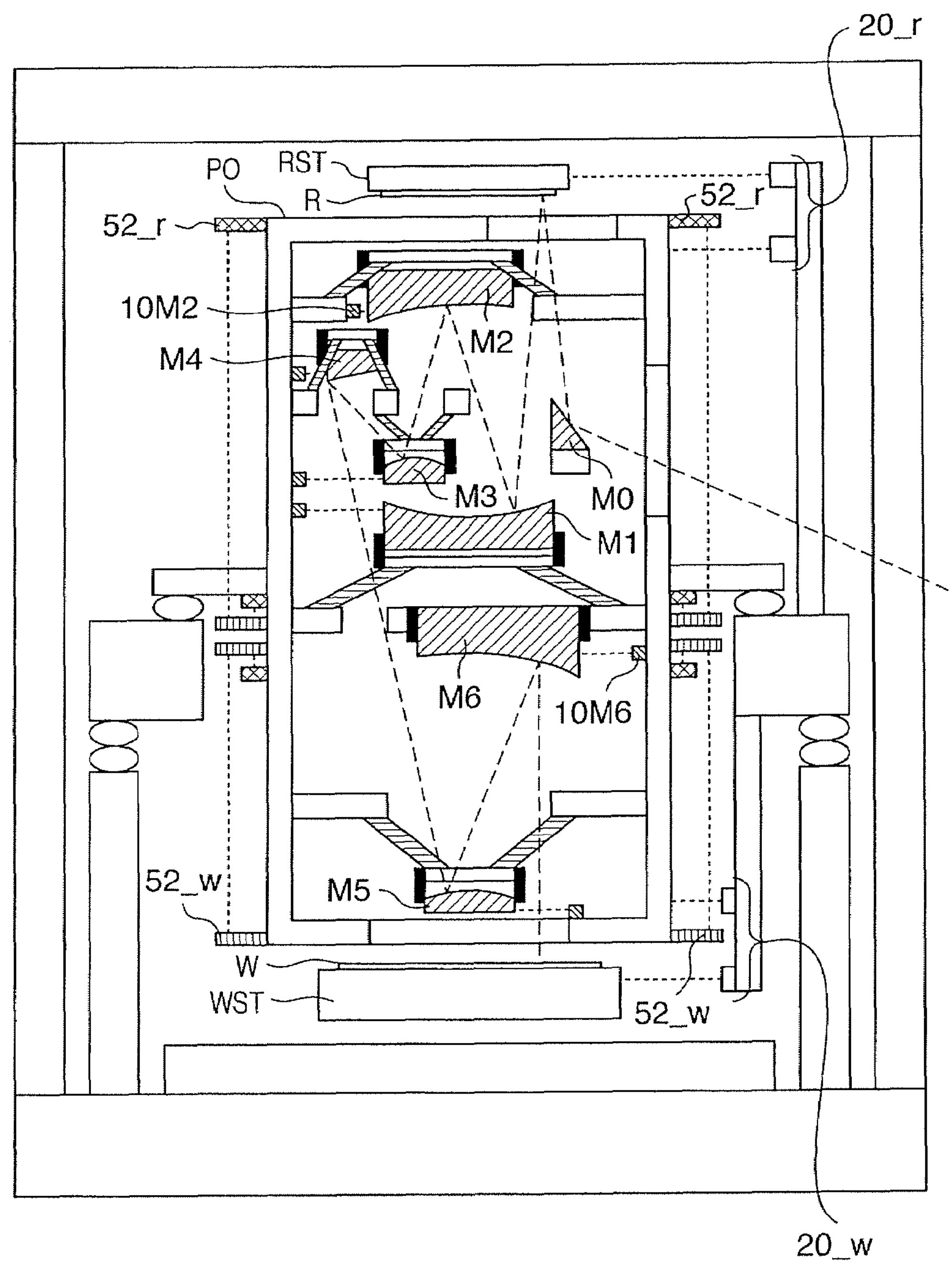
FIG. 13 is a schematic view showing a measuring apparatus for measuring deformation of a lens barrel near a substrate stage.
Figure 14:
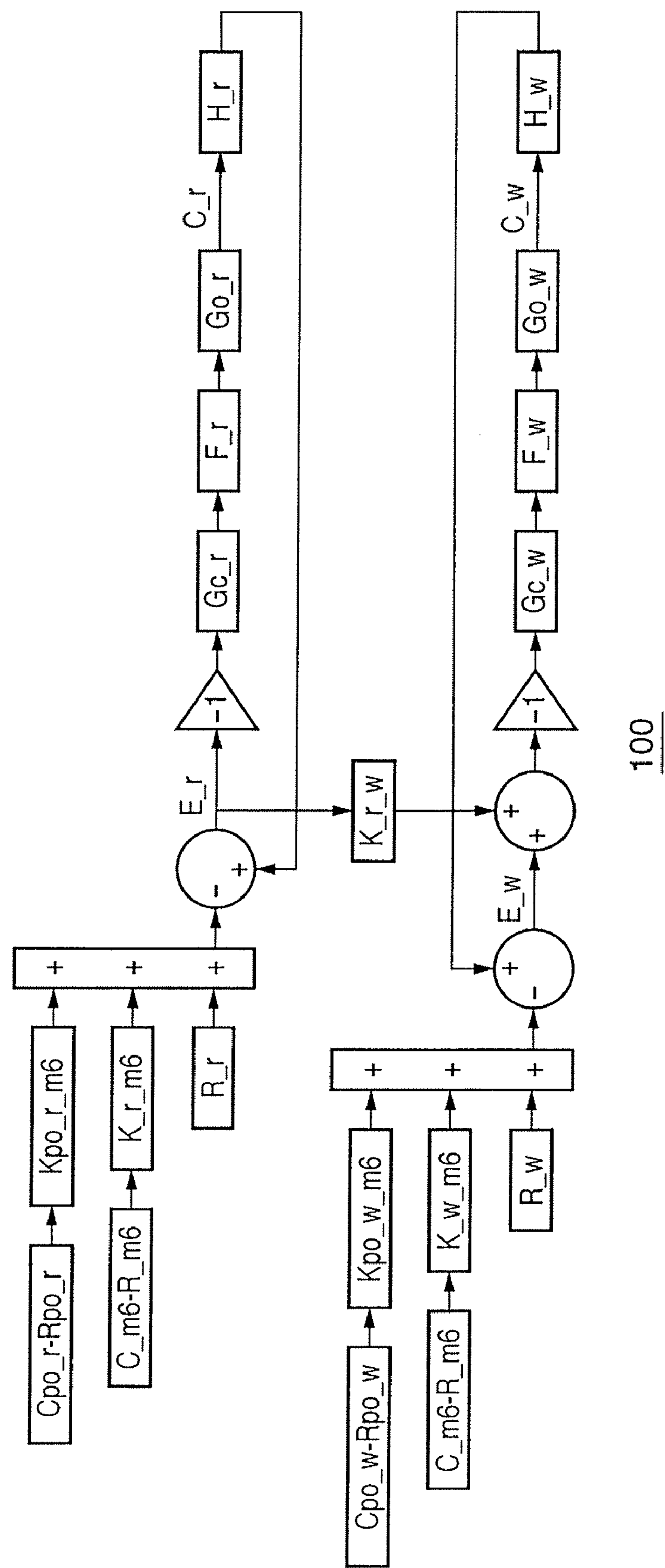
FIG. 14 is a control block diagram of the substrate stage in feeding back deformation of the lens barrel.

In the third embodiment, the original stage RST undergoes positioning control with reference to the sixth optical element 10_m6. As shown in FIG. 13, in the same manner as in the third embodiment, a substrate stage WST may be controlled with reference to a sixth optical element 10_m6 in consideration of the elastic deformation amount of a lens barrel PO. It is desirable to locate a mirror 52*z-w* for measurement or a prism 55*xy*_w (not shown) as close to the substrate stage WST as possible. The deformation amount of the lens barrel PO, near the substrate stage WST, may be estimated on the basis of the deformation amount of its other portion. The substrate stage WST is controlled in synchronism with an original stage RST. FIG. 14 is a block diagram showing a control system 100' in this case. Referring to FIG. 14, reference symbol R_w denotes the target value of the substrate stage WST; and reference symbol C_w denotes measurement information obtained by a measuring apparatus 20__*w*. Reference symbol Gc_w denotes a controller of the substrate stage WST; and reference symbol Go_w denotes a transfer function from the input of an actuator of the substrate stage WST to the output of the position measurement sensor. Reference symbol H_w denotes a decoupled matrix for converting the measurement information C_w, obtained by the measuring apparatus 20__*w*, into six-axis position information at a control point. Reference symbol F_w denotes a thrust distribution matrix for distributing a thrust to each actuator of the substrate stage WST to apply a force to the control point. Reference symbol K_w_m6 denotes a conversion matrix for calculating a positional shift of the substrate stage WST as the sixth optical element 10_m6 shifts. Reference symbol K_r_w denotes a matrix for synchronizing the substrate stage WST with the original stage RST. The matrix K_r_w includes information about the reduction magnification and correction direction. Reference symbol Kpo_w_m6 denotes a correction matrix for multiplying the deformation amount of the lens barrel PO by a given correction amount.

In the fourth embodiment, the position of the substrate stage WST is measured with reference to the lens barrel PO. When the position of the substrate stage WST is to be measured from a reference structure other than the lens barrel PO, it suffices to attach a measuring apparatus 50 to the reference structure and feed back deformation of the reference structure.

Although the measuring apparatus 50 uses a laser interferometer in the fourth embodiment, it may use, e.g., a piezoelectric device, a capacitance sensor, or an eddy current sensor.

Fifth Embodiment

Figure 15:
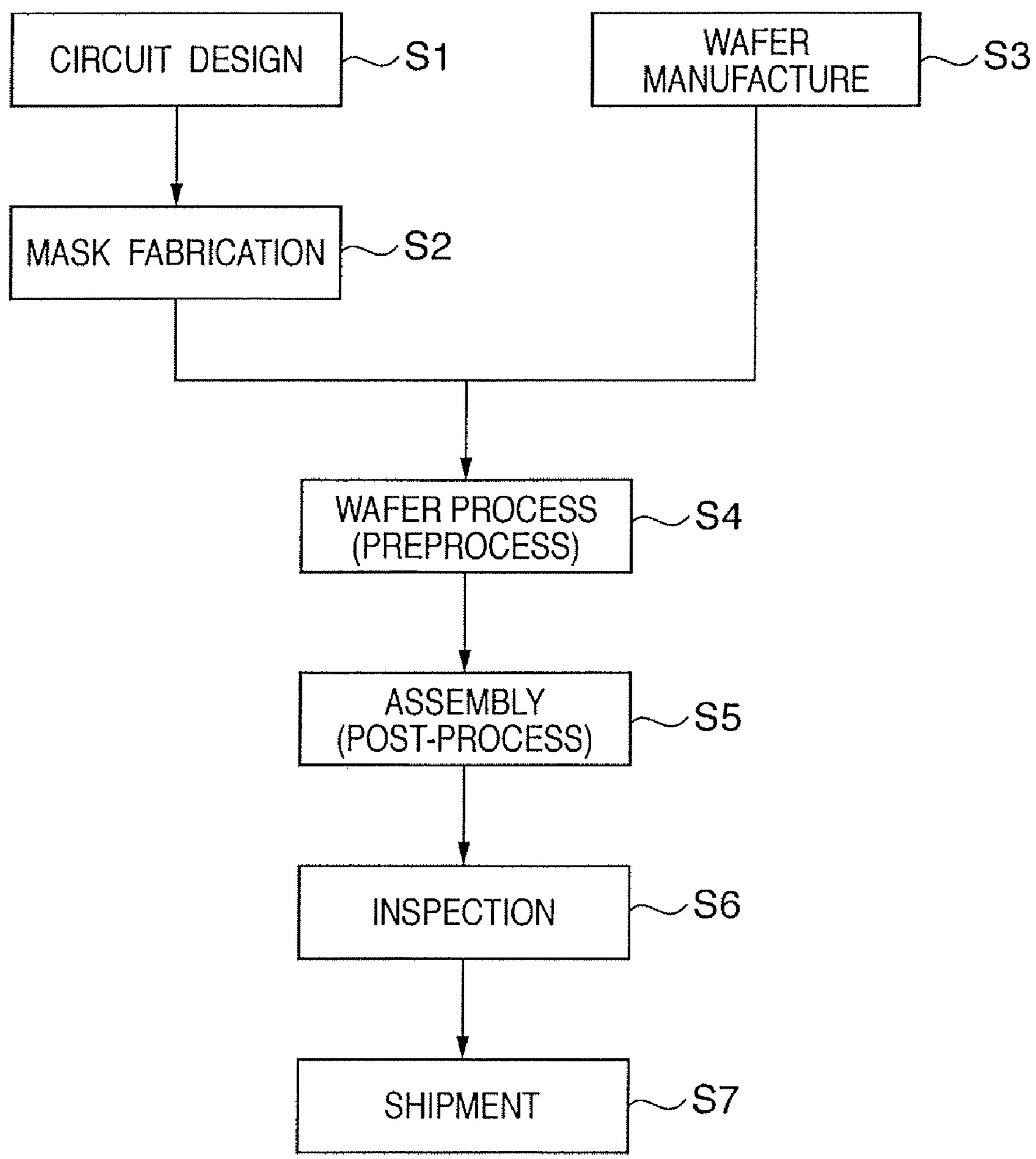
FIG. 15 is a flowchart for explaining device manufacture using the exposure apparatus.

An embodiment of a device manufacturing method using the above-described exposure apparatus will be explained next with reference to FIGS. 15 and 16. FIG. 15 is a flowchart for explaining the manufacture of a device (e.g., a semiconductor chip, such as an IC or an LSI, an LCD, or a CCD). A semiconductor chip manufacturing method will be exemplified here.

In step S1 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step S4 (wafer process), called a pre-process, the above-described exposure apparatus forms an actual circuit on the wafer by lithography, using the mask and wafer. In step S5 (assembly), called a post-process, a semiconductor chip is formed using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped, in step S7.

Figure 16:
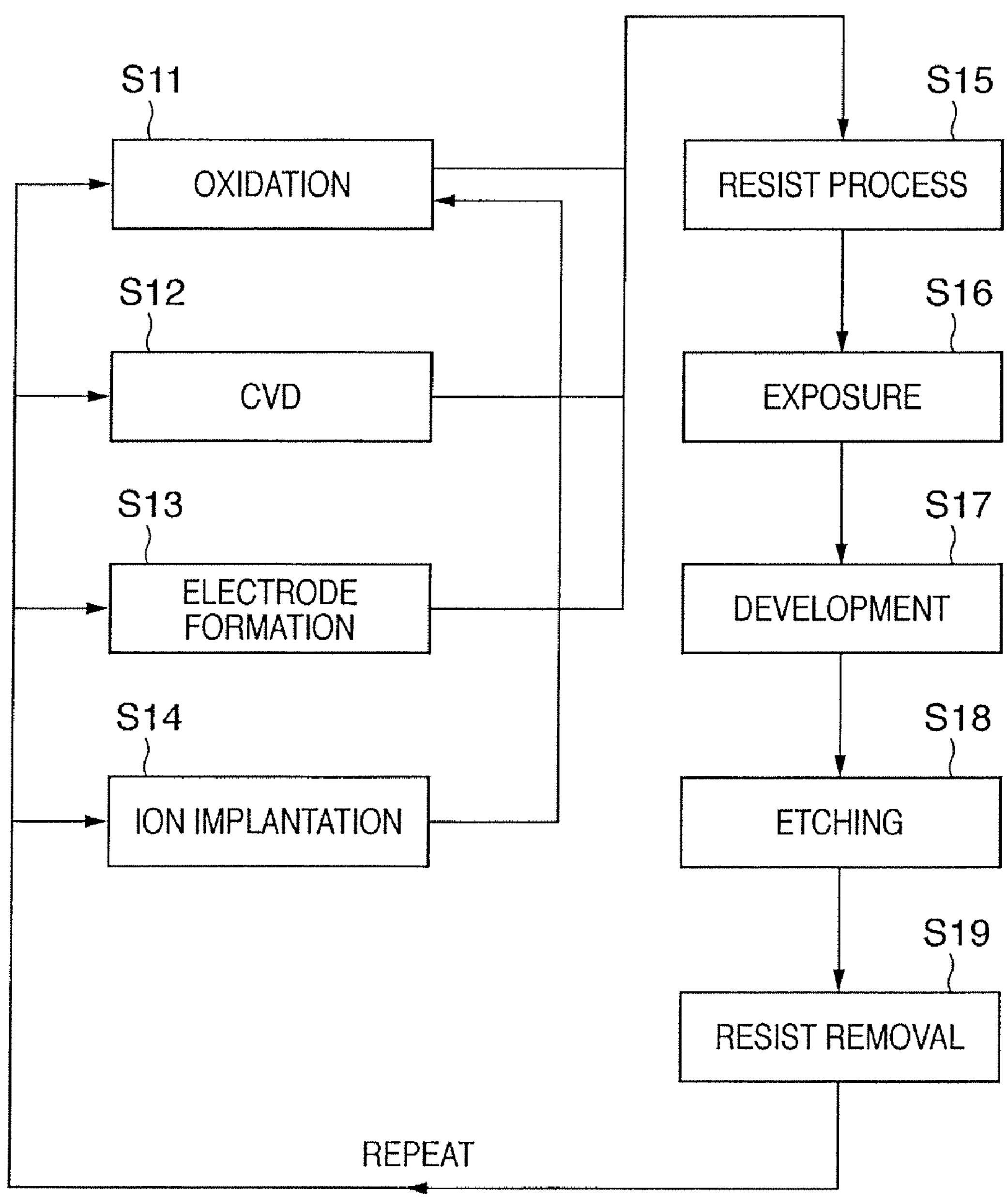
FIG. 16 is a flowchart illustrating details of the wafer process in step S4 of the flowchart shown in FIG. 15.

FIG. 16 is a flowchart showing details of the wafer process in step S4. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the exposure apparatus transfers the circuit pattern of the mask onto the wafer by exposure. In step S17 (development), the exposed wafer is developed. In step S18 (etching), portions other than the developed resist image are etched. In step S19 (resist removal), any unnecessary resist remaining after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An optical apparatus comprising:

a first element;

a second element;

a support which supports said first element;

a first measuring device which measures a position of said first element relative to said support;

a second measuring device which measures a position of said second element relative to said support;

a third measuring device which measures deformation of said support; and a controller which controls a relative position between said first element and said second element on the basis of the measurement results obtained by said first measuring device, said second measuring device, and said third measuring device.

2. The apparatus according to claim 1, wherein said support supports said first element and said second element.

3. The apparatus according to claim 1, wherein said third measuring device includes not less than three Z measuring units, each of which measures a relative displacement in a Z direction due to deformation of said support.

4. The apparatus according to claim 3, wherein said Z measuring unit includes a heterodyne laser interferometer, a first mirror for measurement and a second mirror for measurement respectively corresponding to said first element and said second element are fixed to said support, such that a reflection surface of each of said first mirror for measurement and said second mirror for measurement perpendicularly intersects a Z-axis, said Z measuring unit includes a polarized beam splitter which splits laser light emitted by a laser head into a reflected light and transmitted light, and a mirror which further reflects the reflected light toward said first mirror for measurement, and said polarized beam splitter and said mirror are fixed to an identical supporting member.

5. The apparatus according to claim 3, wherein said third measuring device further includes not less than two X measuring units, each of which measures a relative displacement in an X direction due to deformation of said support, and not less than one Y measuring unit, each of which measures a displacement in a Y direction.

6. The apparatus according to claim 3, wherein said third measuring device further includes not less than one X measuring unit, each of which measures a relative displacement in an X direction due to deformation of said support, and not less than two Y measuring units, each of which measures a relative displacement in a Y direction.

7. The apparatus according to claim 5, wherein one of said X measuring unit and said Y measuring unit includes a heterodyne laser interferometer, a mirror for measurement corresponding to said first element is fixed to said support, such that a reflection surface of said mirror for measurement becomes parallel to a Z-axis, a prism corresponding to said second element is fixed to said support, said optical apparatus further includes a polarized beam splitter which splits laser light emitted by a laser head into reflected light and transmitted light, and a mirror which reflects the light that is transmitted through said polarized beam splitter and emerges from said prism, and said polarized beam splitter, said mirror, and said mirror for measurement are fixed to an identical supporting member.

8. The apparatus according to claim 6, wherein one of said X measuring unit and said Y measuring unit includes a heterodyne laser interferometer, a mirror for measurement corresponding to said first element is fixed to said support, such that a reflection surface of said mirror for measurement becomes parallel to a Z-axis, a prism corresponding to said second element is fixed to said support, said optical apparatus further includes a polarized beam splitter which splits laser light emitted by a laser head into reflected light and transmitted light, and a mirror which reflects the light that is transmitted through said polarized beam splitter and emerges from said prism, and said polarized beam splitter, said mirror, and said mirror for measurement are fixed to an identical supporting member.

9. An exposure apparatus comprising:

an original, as a first element;

a substrate, as a second element;

a support which supports said first element;

a first measuring device which measures a position of said first element relative to said support;

a second measuring device which measures a position of said second element relative to said support;

a third measuring device which measures deformation of said support;

a controller which controls a relative position between said first element and said second element on the basis of the measurement results obtained by said first measuring device, said second measuring device, and said third measuring device; and an exposure unit for transferring a pattern on the original, as the first element, onto the substrate, as the second element, by exposure.

10. A device manufacturing method comprising the steps of:

providing an original, as a first element;

providing a substrate, as a second element;

supporting the first element by a support;

measuring, by a first measuring device, a position of the first element relative to the support;

measuring, by a second measuring device, a position of the second element relative to the support;

measuring, by a third measuring device, deformation of the support;

controlling, by a controller, a relative position between the first element and the second element on the basis of the measurement results obtained by the first measuring device, the second measuring device, and the third measuring device;

transferring, by an exposure unit, a pattern on the original, as the first element, onto the substrate, as the second element, by exposure, to produce an exposed wafer;

developing the exposed wafer to produce a developed wafer; and processing the developed wafer in order to manufacture a device.

* * * * *